United States Patent
Martschenko et al.

(10) Patent No.: US 11,073,582 B2
(45) Date of Patent: Jul. 27, 2021

(54) APPARATUS AND METHOD FOR B1 LIMITING

(71) Applicant: Siemens Healthcare GmbH, Erlangen (DE)

(72) Inventors: Georg Martschenko, Nuremberg (DE); Jürgen Nistler, Erlangen (DE); Markus Vester, Nuremberg (DE); Christian Wünsch, Röthenbach a.d.Pegnitz (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/713,617

(22) Filed: Dec. 13, 2019

(65) Prior Publication Data
US 2020/0191888 A1 Jun. 18, 2020

(30) Foreign Application Priority Data
Dec. 13, 2018 (EP) .................................. 18212446

(51) Int. Cl.
*G01R 33/36* (2006.01)
*G01R 33/48* (2006.01)

(52) U.S. Cl.
CPC ......... *G01R 33/3628* (2013.01); *G01R 33/48* (2013.01)

(58) Field of Classification Search
CPC .......................... G01R 33/3628; G01R 33/48
See application file for complete search history.

(56) References Cited

U.S. PATENT DOCUMENTS

| | | | | |
|---|---|---|---|---|
| 5,903,198 A | * | 5/1999 | Weiss | ........................ H01P 1/32 333/24.1 |
| 8,427,158 B2 | * | 4/2013 | Huish | ................ G01R 33/3692 324/318 |
| 9,581,665 B2 | * | 2/2017 | Boskamp | ........... G01R 33/3685 |
| 2010/0167668 A1 | | 7/2010 | Nistler | |
| 2013/0278264 A1 | * | 10/2013 | Boskamp | ........... G01R 33/3685 324/318 |

FOREIGN PATENT DOCUMENTS

DE 102008063630 A1 8/2010
JP 2006158817 A 6/2006

OTHER PUBLICATIONS

European Search Report for European Patent Application No. 18212446.1-1022 dated Jun. 21, 2019.

* cited by examiner

*Primary Examiner* — Dixomara Vargas
(74) *Attorney, Agent, or Firm* — Lempia Summerfield Katz LLC

(57) ABSTRACT

A magnetic resonance tomography unit and a method for operating the magnetic resonance tomography unit are provided. The magnetic resonance tomography unit includes a transmitter for generating excitation pulses with a wavelength lambda, an antenna for emitting the excitation pulses, a feed line, and a voltage sensor. The voltage sensor is arranged on the feed line at an effective distance corresponding to a multiple of half the wavelength lambda from a feed point on the antenna.

13 Claims, 2 Drawing Sheets

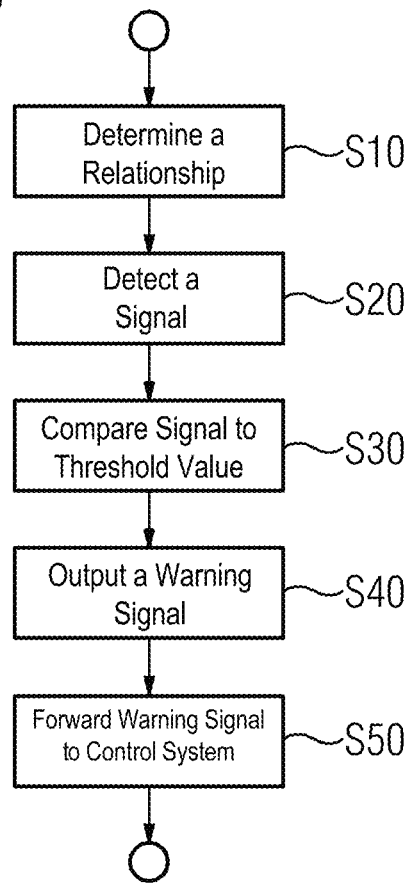

APPARATUS AND METHOD FOR B1 LIMITING

This application claims the benefit of European Patent Application No. EP 18212446.1, filed on Dec. 13, 2018, which is hereby incorporated by reference in its entirety.

BACKGROUND

The present embodiments relate to B1 field limiting.

Magnetic resonance tomography units are imaging apparatuses that, in order to map an object under examination, align nuclear spins of the object under examination with a strong external magnetic field and excite the nuclear spins to precess about this alignment by an alternating magnetic field. The precession or return of the spins from this excited state into a state with lower energy in turn generates an alternating magnetic field as a response that is received via antennas.

With the aid of magnetic gradient fields, the signals are impressed with spatial encoding that subsequently enables an assignment of the received signal to a volume element. The received signal is then evaluated, and three-dimensional imaging of the object under examination is provided.

The strongest possible alternating B1 field from the excitation pulses is desirable in order to excite the nuclear spins as strongly as possible and obtain the strongest possible magnetic resonance signal, and thus, achieve a better signal-to-noise ratio (SNR). However, at the same time, there are limit values for the alternating B1 field that are not to be exceeded due to regulatory requirements in order to provide that the patient is not endangered by overheating due to absorbed power and/or induced voltages and currents. For example, at low frequencies (e.g., below 100 MHz, 50 MHz, or 30 MHz), the achievable field strength is heavily dependent on the antenna tuning and quality factor, which may change due, for example, to the size, weight, and position of the patient.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the quality and safety of image capture with magnetic resonance tomography units may be improved compared to the prior art.

The magnetic resonance tomography unit according to an embodiment includes a transmitter for generating excitation pulses. The frequency of the excitation pulse is the Larmor frequency of a nuclear spin of an element to be examined (e.g., hydrogen) in the static B0 field of a field magnet of the magnetic resonance tomography unit. The gradient fields for spatial resolution may also cause the frequency of the excitation pulse to vary about the Larmor frequency in the B0 field.

The excitation pulse is assigned a wavelength lambda. The wavelength lambda is the wavelength of the electromagnetic signal generated by the transmitter as an excitation pulse and is defined by a propagation velocity c in vacuum divided by the frequency.

The magnetic resonance tomography unit also includes an antenna for emitting the excitation pulses and a feed line between the transmitter and a feed point of the antenna. The feed line designates the electric line that conducts the excitation pulse from the transmitter to the antenna. The feed line may, for example, be a coaxial cable or a flat webbed cable. The feed line may also include further elements such as, for example, a power divider in order to divide the signal from a transmitter between several antennas.

The wavelength lambda on the feed line is usually 10%, 20%, or more shorter than a wavelength of an electromagnetic wave in vacuum at the Larmor frequency.

The antenna is, for example, a body coil (e.g., a "birdcage" antenna). The feed point is the transfer point from the feed line to the antenna, which, in the case of a birdcage antenna, lies on the end ring. Herein, the transmitter is to be configured to generate excitation pulses at the Larmor frequency with a power of several hundred watts to kilowatts.

The magnetic resonance tomography unit also includes a voltage sensor. The voltage sensor may be arranged on the feed line at an effective distance from the feed point corresponding to a multiple of half the wavelength lambda equal to n*lambda/2, where n is a natural number.

Effective distance n*lambda/2 designates a geometric distance along the feed line starting from the feed point for which there is a phase shift of the electromagnetic wave between the voltage sensor and the feed point of n*180 degrees or n*Pi corresponding to a distance in vacuum with the length n*lambda/2.

The effective distance may be extended with respect to the geometric length by the propagation velocity reduced with respect to the velocity of light in vacuum by dielectric and geometry. There may also be a phase shift caused by matching elements, which change the effective distance. The real position of the voltage sensor may deviate from the calculated position within a tolerance (e.g., the Larmor frequency) due to a static magnetic field B0 that varies from device to device by more than 1%, 2%, 5%, or 10%.

The voltage sensor supplies a signal that depends on the electrical potential on the feed line at the location of the voltage sensor.

Due to the effective distance according to one or more of the present embodiments, the voltage sensor supplies a measured value that reflects the voltage at the antenna feed point. The magnetic field B1 generated is substantially proportional to the current in the antenna. The voltage detected via the voltage sensor for the feed point is also substantially proportional to the current in the antenna and hence also to the B1 field of the antenna for resonant antennas with which the oscillating current in the antenna is significantly greater than that supplied via the feed line. Thus, the voltage detected by the voltage sensor is a good measure for the B1 field of the antenna.

In one embodiment of the magnetic resonance tomography unit, the feed line includes a matching circuit between the voltage sensor and the feed point for matching the impedance of the transmitting antenna to the feed line. The matching circuit causes a phase shift due to these components. The feed line is configured such that the accumulated phase shift between the voltage sensor and the feed point caused by the length of the feed line between the voltage sensor and the feed point and by the matching circuit itself corresponds to a phase shift for the excitation pulse caused by a distance in vacuum with the length n*lambda/2.

It is also possible with a feed line with a matching circuit for the antenna to enable a reliable measurement of the voltage at the feed point and determination of the B1 field generated by taking account of the phase shift of the matching circuit when determining the distance between the voltage sensor and the feed point.

In one embodiment of the magnetic resonance tomography unit, the matching circuit includes one, two, or more capacitors and/or inductors. For example, a PI element is frequently used as a matching circuit for antennas.

A matching circuit with capacitors and, for example, ferrite-free inductors in the environment of a magnetic resonance tomography unit offers a simple and safe possibility for matching the transmitter to the antenna.

In one embodiment of the magnetic resonance tomography unit, the voltage sensor includes a capacitive coupling. A capacitive coupling may designate a coupling based on the electric field and potential and not the flowing currents (e.g., not on induction). The capacitive coupling is not conductive for frequencies approaching zero (e.g., the voltage sensor is isolated from the feed line for DC voltages).

For example, in conjunction with a high-impedance voltage sensor, the capacitive coupling minimizes the effect of the sensor on the feed line and at the same time isolates with respect to DC voltages that are applied.

In one embodiment, the voltage sensor is configured to output a signal that is proportional to the square of the voltage on the feed line. For example, a diode probe may be provided.

The quadratic characteristic curve enables inferences to be drawn directly from the signal from the voltage sensor regarding the power at the feed point and hence directly regarding the squared value of the B1 field and a value that is relevant and proportional for the SAR load.

In one embodiment of the magnetic resonance tomography unit, the magnetic resonance tomography unit includes a monitoring circuit. The monitoring circuit is in signal communication with the voltage sensor in order to receive a signal in dependence on the voltage detected by the voltage sensor. The monitoring circuit is also in signal communication with the transmitter. The monitoring circuit and the transmitter are configured such that the monitoring circuit may influence a power output of the transmitter via the signal communication. The monitoring circuit is configured to interrupt a transmission by the transmitter when a signal from the voltage sensor exceeds a predetermined threshold value. For example, the signal from the voltage sensor may be compared with a predetermined threshold value in the monitoring circuit using a comparator. If the signal, and hence the radiant power received by the patient, is too high, the monitoring circuit may reduce an input signal of the transmitter via the signal communication, for example, via an adjustable resistor of the transmitter or switch the input signal of the transmitter off via a switch.

The voltage sensor and the monitoring circuit enable the transmit power to be monitored in real time.

In one embodiment of the magnetic resonance tomography unit, the magnetic resonance tomography unit includes a tuning element. The tuning element may, for example, be a variable capacitor or inductor. The tuning element is electrically connected to the feed line at the location of the voltage sensor.

As a result of the above-described effective length of the feed line, the tuning element functions in the same way as a tuning element of the same kind at the feed point. The tuning element is arranged at a distance from the immediate surroundings of the image capture which, for example, enables the use of materials that influence the static magnetic field directly at the location of the image capture and would interfere with the image capture. Thus, it is, for example, also possible for motorized tuning elements to be used.

In one embodiment of the magnetic resonance tomography unit, the transmitter includes a control input. A control input is considered to be an input to which a signal may be applied, where the output signal from the transmitter is then dependent on this signal (e.g., the voltage and phase of the output signal). The voltage sensor is in signal communication with the control input.

Thus, a quick and inexpensive way of controlling the radiant power received by the patient may be provided.

In one embodiment of the magnetic resonance tomography unit, the magnetic resonance tomography unit includes a second sensor. The second sensor is configured to supply a signal in dependence on an amplitude and phase and the propagation direction of a radio-frequency signal on the feed line. For example, the second sensor may be a directional coupler.

The second sensor also enables the detection of a direction-dependent power component, so that it also possible to determine reflected powers. Thus, the power of the B1 field generated by the transmitter may be detected even more accurately. At the same time, the second sensor enables a function check on the voltage sensor.

The method according to one or more of the present embodiments for operating the magnetic resonance tomography unit includes detecting a signal from the voltage sensor with the monitoring circuit. In another act, the signal is compared with a predetermined threshold value by the monitoring circuit. In a further act, the monitoring circuit outputs a warning signal when the predetermined threshold value is exceeded. The warning signal may, for example, be supplied to an operator of the magnetic resonance tomography unit via a display or acoustically, or output to a control system of the magnetic resonance tomography unit or to the transmitter to enable countermeasures to be implemented. In one embodiment, the warning signal may be supplied to the transmitter in one act and may cause the transmit signal to be interrupted or limited.

The method according to one or more of the present embodiments enables the SAR load on the patient to be monitored by the voltage proportional to the B1 field and, if necessary, measures to be taken to ensure the safety of the patient if the limit values are exceeded.

In one embodiment of the method, the method further includes the act of determining, for calibration, a relationship between the signal from the voltage sensor and B1 field strength. In one embodiment, using, for example, a field probe or a phantom, the field strength B1 achieved by an excitation pulse may be determined. If the voltage at the voltage sensor is also detected during the excitation pulse, a proportionality factor may be determined between B1 and the measured voltage for the calibration.

The calibration enables a direct inference to be drawn regarding the measured voltage at voltage sensor in relation to the generated B1 field strength. For example, the magnetic field may be monitored in real time by the voltage, and the pulse may be interrupted immediately in the event of the limit values being exceeded in order to ensure the safety of the patient.

BRIEF DESCRIPTION OF THE DRAWINGS

FIG. 3 is a schematic flow diagram of one embodiment of a method for operating a magnetic resonance tomography unit.

DETAILED DESCRIPTION

Figure 1:
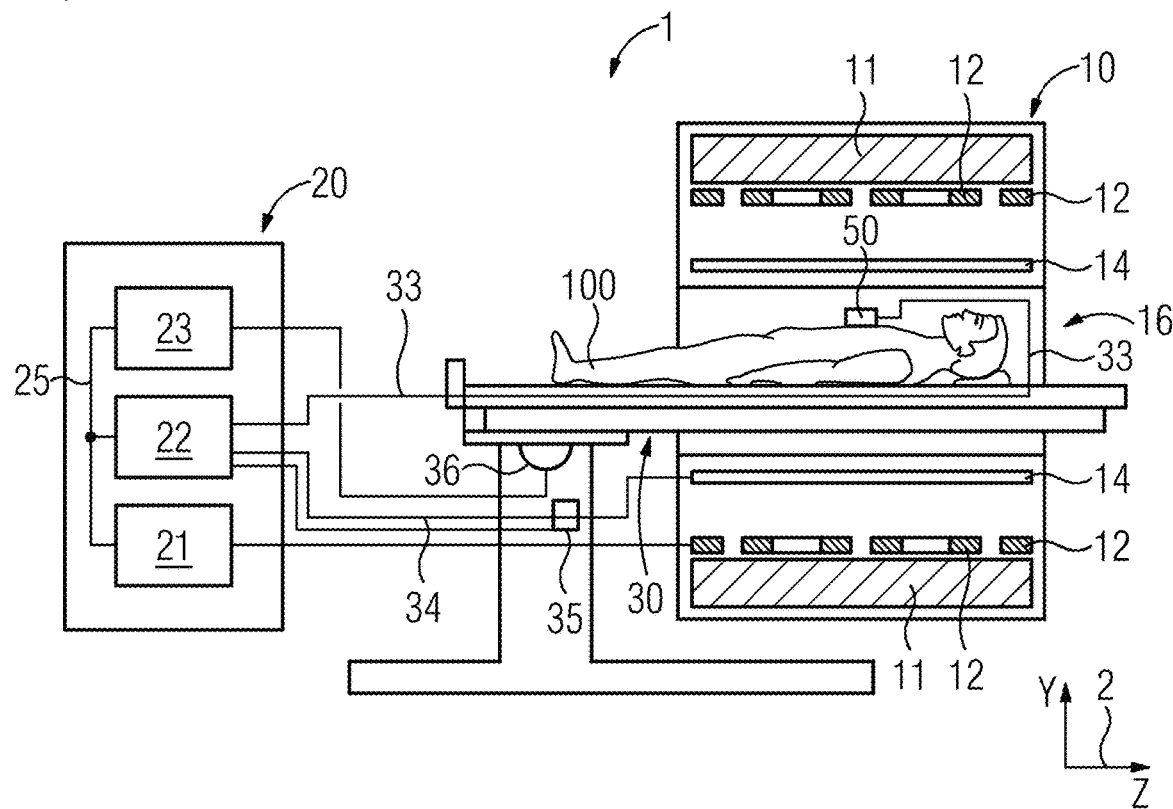
FIG. 1 is a schematic depiction of one embodiment of a magnetic resonance tomography unit.

FIG. 1 is a schematic depiction of an embodiment of a magnetic resonance tomography (MRT) unit 1.

The MRT unit 1 includes a magnet unit 10. The magnet unit 10 includes a field magnet 11 that generates a static magnetic field B0 for aligning nuclear spins of samples or a patient 100 in a recording region. The recording region is characterized by an extremely homogeneous static magnetic field B0, where the homogeneity relates to, for example, the magnetic field strength or the magnitude. The recording region is almost spherical and is arranged in a patient tunnel 16 extending in a longitudinal direction 2 through the magnet unit 10. A patient bench 30 may be moved in the patient tunnel 16 by a moving unit 36. The field magnet 11 is usually a superconducting magnet able to provide magnetic fields with a magnetic flux density of up to 3T or more in the case of latest devices. It is, however, also possible to use permanent magnets or electromagnets with normally conducting coils for lower field strengths.

The magnet unit 10 further includes gradient coils 12 configured for spatial differentiation of the acquired imaging regions in the examination volume, to superimpose the magnetic field B0 variable magnetic fields in three spatial directions. The gradient coils 12 are usually coils made of normally conducting wires able to generate fields that are orthogonal to one another in the examination volume.

The magnet unit 10 also includes a body coil 14 configured to emit a radio-frequency signal supplied via a feed line 34 into the examination volume and to receive resonance signals emitted by the patient 100 and emit the received resonance signals via a signal line. The feed line 34 is electrically connected to the body coil 14 at a feed point. A voltage sensor 35 is electrically connected to the feed line 34 at a distance d along the feed line from the feed point and is in signal communication with the radio-frequency unit 22.

A control unit 20 (e.g., a controller) supplies the magnet unit 10 with the different signals for the gradient coils 12 and the body coil 14 and evaluates the received signals.

Thus, the control unit 20 includes a gradient activation system 21 configured to supply the gradient coils 12 via leads with variable currents that provide the desired gradient fields in the examination volume in temporal coordination.

The control unit 20 further includes a radio-frequency unit 22 configured to generate a radio-frequency pulse with a prespecified temporal course, amplitude, and spectral power distribution in order to excite a magnetic resonance of the nuclear spins in the patient 100. Herein, pulse powers in the kilowatt range may be achieved. The excitation pulses may be radiated into the patient 100 via the body coil 14 or also via a local transmitting antenna.

A control system 23 communicates with the gradient control system 21 and the radio-frequency unit 22 via a signal bus 25.

A local coil 50 connected to the radio-frequency unit 22 and a receiver of the radio-frequency unit 22 by a connecting lead 33 is arranged on the patient 100.

Figure 2:
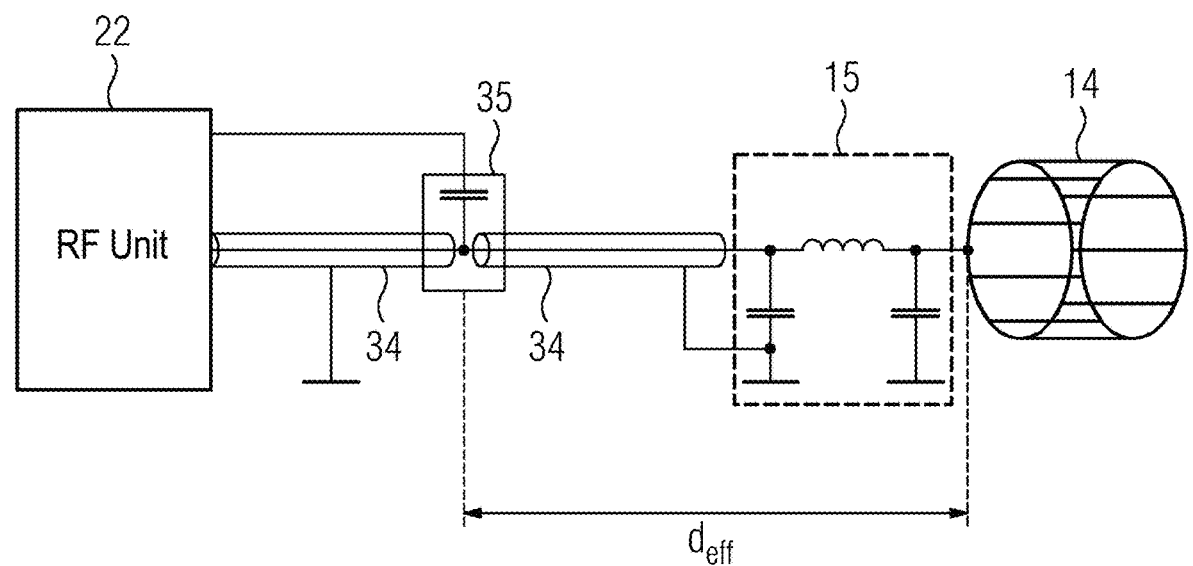
FIG. 2 is a schematic diagram of a transmitter, an antenna, a feed line, and a voltage sensor of a magnetic resonance tomography unit according to an embodiment.

FIG. 2 is a schematic illustration of an exemplary interaction of the transmitter, the feed line 34, the voltage sensor 35, and the antenna 14.

As a transmitter, the radio-frequency unit 22 outputs the excitation pulse to a feed line 34 connecting the radio-frequency unit 22 to the body coil 14 as an antenna. However, in principle, a local coil 50 may be the antenna.

In the simplest case, the feed line 34 is a line that transmits the radio-frequency signal or the excitation pulse from the radio-frequency unit 22 to the antenna, which in FIG. 2, is depicted by the body coil 14. Generally, a coaxial cable is used because of a shielding outer conductor. Other radio-frequency lines, such as flat webbed cables, may, however, be provided as the feed line 34.

In the embodiment depicted in FIG. 2, for the purposes of the present embodiments, the feed line 34 also includes a matching circuit 15 that provides impedance matching between the impedance of the feed line 34 and the body coil 14. The matching circuit 15 may, as depicted, be implemented by a PI element, but also by individual or multiple capacitors and/or inductors. If the antenna has the same impedance at the feed point as the feed line 34, a matching circuit 15 may be dispensed with.

In one embodiment, other elements may be provided in the feed line 34 between the transmitter and the voltage sensor 35, such as, for example, a power divider in order to divide the power of the transmitter between several feed lines 34 and antennas.

The voltage sensor 35 is arranged at distance d from the feed point, measured along an extension of the feed line 34. According to one or more of the present embodiments, the phase shift caused by the feed line 34 between the voltage sensor 35 and the feed point for a radio-frequency signal at the Larmor frequency $f_L$ corresponds to a value of n*Pi or n*180 degrees, where n is a natural number greater than zero. For a feed line with a fictious propagation velocity c as in vacuum, the distance d would be $$d = n*\text{lambda}/2 \text{ where lambda} = c/f_L$$

On a real feed line 34, such as, for example, a coaxial cable of the type RG213, the propagation velocity is reduced by a factor of 0.66. To provide a phase shift of $c/f_L$ as in vacuum, the effective distance d on the coaxial cable should be multiplied by the factor 0.66. The effective distance obtained for a cable RG213 coaxial is $$d_{\mathit{eff}} = 0.66*n*\text{lambda}/2 \text{ where lambda} = c/f_L$$

Further corrections are necessary if the matching circuit 15 causes a further phase shift $\varphi$. Then, the following effective distance is obtained $$d_{\mathit{eff}} = 0.66*(n*\text{lambda}*(\tfrac{1}{2} - \varphi/(2*Pi))) \text{ where lambda} = c/f_L$$

The voltage sensor 35 is arranged on the feed line 34 at a distance deff from the feed point of the body coil 14 such that a phase shift of lambda/2 is obtained between the voltage sensor 35 and the antenna feed point or body coil 14. As a result of this phase shift, in each case, a voltage value corresponding to the voltage at the feed point is obtained at the location of the voltage sensor 35 for an excitation pulse at the Larmor frequency or wavelength lambda.

The magnetic field B1 generated is substantially proportional to the current in the antenna. The voltage detected via the voltage sensor 35 for the feed point is proportional to the current in the antenna and hence also to the B1 field of the antenna. This substantially also applies to cases in which, due to resonance, the current in the antenna is greater than the current supplied via the feed line. At least for typical resonant antennas with quality factors greater than 50, this is fulfilled in good approximation. Therefore, the voltage at the voltage sensor 35 with a proportionality factor obtained, for example, by calibration is a good measure for the B1 field generated by the antenna.

The voltage sensor 35 may be capacitively coupled to the feed line 34 in order to exert as little influence as possible on the transmitter signal. Herein, a high voltage sensor impedance is advantageous. However, a resistive coupling with high impedance, where then there is no galvanic isolation, may also be provided.

Further sensor signals may be combined with the signal from the voltage sensor 35 in order to detect a sensor malfunction. For example, directional couplers in the feed line 34 that return a reflected power or a power sent to the antenna by a sensor signal to the radio-frequency unit 22 in order, for example, to enable the matching by the matching circuit 15 to be adjusted or to protect the output stages in that the power output from radio-frequency unit 22 is reduced may be provided. The monitoring circuit may, for example, carry out a plausibility check. If one of the sensor values is constantly zero while the other one changes with the activation of the control system of the transmitter, a malfunction of a sensor may be inferred, and the monitoring circuit may interrupt the emission of the excitation pulse for safety reasons.

FIG. 3 is a schematic flow diagram of a method according to an embodiment for operating the magnetic resonance tomography unit 1.

In act S20, a signal from the voltage sensor 35 is detected with the monitoring circuit. The signal may be detected as analog by the voltage sensor 35 and forwarded via a signal line to the monitoring circuit. However, the signal may also be digitized with a A/D converter, and the digital voltage signal may be forwarded via a bus or a line.

In act S30, the monitoring circuit compares the detected voltage signal from the voltage sensor 35 with a predetermined threshold value. The predetermined threshold value may, for example, be defined by regulatory requirements relating to the SAR load. This may be done by a simple comparator in the case of an analog signal and when in digital form by hardwired logic in order to increase reliability or by programmed logic in a control system of the monitoring circuit. The actual monitoring circuit may also be implemented by a program in the control system 23 of the magnetic resonance tomography unit.

In act S40, the monitoring circuit outputs a warning signal when the predetermined threshold value is exceeded. The warning signal may then be output to an operator, for example, acoustically or via a display.

In one embodiment, the warning signal may be forwarded to the control system 23, which then interrupts the transmission of the excitation pulse. This enables a particular quick reaction when a SAR threshold value is exceeded.

In one embodiment of the method, in act S10, a relationship between the signal from the voltage sensor and B1 field strength is determined for calibration. For this, on the installation of a magnetic resonance tomography unit 1, a field probe may be connected to the control system 23 that supplies a measured value for a B1 field. Thus, simultaneous detection of the signal from the voltage sensor 35 and the signal from the field probe enables a proportionality factor between the B1 field to be determined by an excitation pulse and signal from the voltage sensor 35 using a quotient formation so that a value of the B1 field may be inferred from a detected voltage value of the voltage sensor 35.

In one embodiment, a value for the excitation of the nuclear spins may be inferred by a phantom and an image capture, and a B1 field strength may be ascertained in dependence on the duration of the excitation pulse.

Although the invention has been illustrated in greater detail by the exemplary embodiments, the invention is not restricted by the disclosed examples, and other variations may be derived herefrom by the person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography unit comprising:
   a transmitter configured to generate excitation pulses with a wavelength, lambda;
   an antenna configured to emit the generated excitation pulses;
   a feed line between the transmitter and a feed point of the antenna; and
   a voltage sensor that is arranged at an effective distance corresponding to a multiple of half the wavelength from the feed point.

2. The magnetic resonance tomography unit of claim 1, wherein the feed line comprises a matching circuit between the voltage sensor and the feed point, the matching circuit being configured to match an impedance of the transmitter to the feed line, and
   wherein a phase shift caused by the feed line between the voltage sensor and the feed point corresponds to a length n*lambda/2.

3. The magnetic resonance tomography unit of claim 2, wherein the matching circuit comprises one or more capacitors, inductors, or the one or more capacitors and the inductors.

4. The magnetic resonance tomography unit of claim 1, wherein the voltage sensor comprises a capacitive coupling.

5. The magnetic resonance tomography unit of claim 1, wherein the voltage sensor is configured to output a signal that is proportional to the square of a voltage on the feed line.

6. The magnetic resonance tomography unit of claim 1, further comprising a monitoring circuit that is in signal communication with the voltage sensor and the transmitter,
   wherein the monitoring circuit is configured to interrupt a transmission by the transmitter when a signal from the voltage sensor exceeds a predetermined threshold value.

7. The magnetic resonance tomography unit of claim 1, further comprising a tuning element,
   wherein the tuning element is electrically connected to the feed line at a location of the voltage sensor.

8. The magnetic resonance tomography unit of claim 1, wherein the transmitter comprises a control input, and the voltage sensor is in signal communication with the control input.

9. The magnetic resonance tomography unit of claim 1, wherein the voltage sensor is a first sensor, and
wherein the magnetic resonance tomography unit further comprises a second sensor configured to supply a signal in dependence on an amplitude and a propagation direction of a radio-frequency signal on the feed line.

10. A method for operating a magnetic resonance tomography unit, the magnetic resonance tomography unit comprising a transmitter configured to generate excitation pulses with a wavelength, lambda, an antenna configured to emit the generated excitation pulses, a feed line between the transmitter and a feed point of the antenna, a voltage sensor that is arranged at an effective distance corresponding to a multiple of half the wavelength from the feed point, and a monitoring circuit that is in signal communication with the voltage sensor and the transmitter, wherein the monitoring circuit is configured to interrupt a transmission by the transmitter when a signal from the voltage sensor exceeds a predetermined threshold value, the method comprising:

detecting the signal from the voltage sensor with the monitoring circuit;
comparing, by the monitoring circuit, the signal with the predetermined threshold value; and
outputting, by the monitoring circuit, a warning signal when the predetermined threshold value is exceeded.

11. The method of claim 10, further comprising determining, for calibration, a relationship between the signal from the voltage sensor and a B1 field strength.

12. The method of claim 10, further comprising outputting, by the voltage sensor, a signal that is proportional to the square of a voltage on the feed line.

13. The method of claim 1, wherein the voltage sensor is a first sensor,
wherein the magnetic resonance tomography unit further comprises a second sensor, and
wherein the method further comprises supplying, by the second sensor, a signal in dependence on an amplitude and a propagation direction of a radio-frequency signal on the feed line.

* * * * *